(12) United States Patent
Hadano et al.

(10) Patent No.: US 7,746,197 B2
(45) Date of Patent: Jun. 29, 2010

(54) NOISE FILTER ARRAY

(75) Inventors: Kenjiro Hadano, Sabae (JP); Tomohiro Sasaki, Fukui (JP); Haruhiko Ueno, Sabae (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/352,027

(22) Filed: Jan. 12, 2009

(65) Prior Publication Data

US 2009/0108958 A1    Apr. 30, 2009

Related U.S. Application Data

(63) Continuation of application No. PCT/JP2007/063994, filed on Jul. 13, 2007.

(30) Foreign Application Priority Data

Jul. 27, 2006    (JP)    .............................. 2006-205291

(51) Int. Cl.
    *H03H 7/00*    (2006.01)
(52) U.S. Cl. ...................... 333/185; 333/134; 333/175
(58) Field of Classification Search .................. 333/126, 333/132, 134, 175, 185, 204; 361/301.4, 361/306.3, 312, 313, 321.3
    See application file for complete search history.

(56) References Cited

U.S. PATENT DOCUMENTS 5,200,703 A    4/1993    Popp et al.
6,097,268 A    8/2000    Watanabe et al.
6,456,481 B1   9/2002    Stevenson

FOREIGN PATENT DOCUMENTS

| DE | 35 45 405 A1 | 7/1987 |
|----|----|----|
| DE | 40 32 707 A1 | 4/1992 |
| GB | 2 198 605 A | 6/1988 |
| JP | 07-010914 U | 2/1995 |
| JP | 09-266430 A | 10/1997 |
| JP | 2005-64267 A | 3/2005 |
| WO | 98/45921 A1 | 10/1998 |

OTHER PUBLICATIONS

Official Communication issued in International Patent Application No. PCT/JP2007/063994, mailed on Oct. 30, 2007.
Sasaki et al.: "Noise Filter Array," U.S. Appl. No. 12/358,318, filed Jan. 23, 2009.
Official Communication issued in corresponding European Patent Application No. 07790774.9, mailed on Sep. 24, 2009.

*Primary Examiner*—Robert Pascal
*Assistant Examiner*—Kimberly E Glenn
(74) *Attorney, Agent, or Firm*—Keating & Bennett, LLP

(57) ABSTRACT

A noise filter array includes filter elements, each of which includes an LC parallel resonant circuit having a coil and a capacitor and an LC series resonant circuit having a coil and a capacitor, are arranged substantially parallel to one another in an array and integrally provided. Grounding capacitors that define the filter elements are arranged so that a common ground-side electrode faces signal-side electrodes and is connected to an inductance adjusting conductor that defines the LC series resonant circuits along with the capacitors through a via hole. The lengths of the inductance adjusting conductor from a connection location within the via hole to ground terminals are substantially equal in each of the filter elements.

14 Claims, 13 Drawing Sheets

NOISE FILTER ARRAY

BACKGROUND OF THE INVENTION

1. Field of the Invention

The present invention relates to a noise filter array in which a plurality of filter elements including an LC parallel resonant circuit and an LC series resonant circuit, each of which includes a coil and a capacitor, are arranged in an array and integrally provided.

2. Description of the Related Art

Various communication modes (GSM mode, DCS mode, and PCS mode, for example) are used for cellular phones. To prevent degradation in the receiving sensitivity in respective communication bands used for these communication modes, it is necessary to effectively remove noise in each of the communication bands.

For example, to remove noise in respective communication bands around 900 MHz and around 1.8 GHz, a noise filter is required to obtain attenuation over a wide band range. To provide a filter having such a wide-range attenuation characteristic, an inductance may be provided by a grounded capacitor to form a double-resonance filter.

Then, in the related art, as shown in FIG. 13, a double-resonance filter element has been disclosed which includes an LC parallel resonant circuit PR arranged so that a stray capacitance C1 is provided in parallel with a coil L1 provided in a signal line and an LC series resonant circuit SR arranged so that a capacitor C2 and a coil L2 are connected in series between the signal line and a ground (for example, Japanese Unexamined Patent Application Publication No. 9-266430).

When a noise filter array is arranged so that a plurality of the existing double-resonance filter elements are provided, and these filter elements are integrally provided with one another, an array structure, for example, has an equivalent circuit as shown in FIG. 14. Note that here, a configuration in which four filter elements are provided is shown as an example.

In the array structure shown in FIG. 14, any LC series resonant circuit portions surrounded by the broken lines in the drawing are grounded. Thus, in order to further simplify the structure, coils included in the respective LC series resonant circuits are integrated. In this case, for example, the structure will be as shown in FIG. 15.

That is, in the noise filter array shown in FIG. 15, signal-side electrodes of capacitors c12 to C42 that define the LC series resonant circuits of the respective filter elements are provided separately for the respective filter elements, while a conductor L0 that defines an inductance coil is commonly connected to ground-side electrodes of these capacitors C12 to C42. Thus, the structure is simplified.

The noise filter array having the structure shown in FIG. 15 can simplify the overall structure. However, distances from the capacitors C12 to C42 of the filter elements F1 to F4 via the conductor L0 to a ground terminal GND are different among capacitors C12 to C42 (for example, the distance from the capacitor C12 to the ground terminal GND is different from the distance from the capacitor C22 to the ground terminal GND). Thus, an inductance value varies among the filter elements F1 to F4 and, as a result, variations in filter characteristic arise among the filter elements F1 to F4.

SUMMARY OF THE INVENTION

To overcome the problems described above, preferred embodiments of the present invention provide a noise filter array that has a simple overall structure and that eliminates variations in characteristic among a plurality of filter elements.

A noise filter array according to a preferred embodiment of the present application includes a plurality of filter elements, each of which includes an LC parallel resonant circuit having a coil and a capacitor and an LC series resonant circuit having a coil and a capacitor that are arranged substantially in parallel with one another in an array and integrally provided. In the noise filter array, a single common ground-side electrode of grounding capacitors that respectively define the LC series resonant circuits of the filter elements is arranged so as to face signal-side electrodes of the grounding capacitors, and the ground-side electrode is connected through a via hole to an inductance adjusting conductor that defines the LC series resonant circuits with the grounding capacitors, and the length from a connection location, at which the inductance adjusting conductor is connected to the via hole, to a ground terminal is substantially equal in each of the filter elements.

A noise filter array according to another preferred embodiment of the present invention includes a plurality of filter elements, each of which includes an LC parallel resonant circuit having a coil and a capacitor and an LC series resonant circuit having a coil and a capacitor, are arranged substantially in parallel with one another in an array and integrally provided. In the noise filter array, a single common ground-side electrode of grounding capacitors that respectively define the LC series resonant circuits of two filter elements is arranged so as to face signal-side electrodes of the grounding capacitors, and the ground-side electrode is connected through a via hole to an inductance adjusting conductor that defines the LC series resonant circuits with the grounding capacitors, and the lengths from a connection location, at which the inductance adjusting conductor is connected to the via hole, to a ground terminal is substantially equal in each of the filter elements, and the filter elements are arranged on both sides of the inductance adjusting conductor in its laminated direction two by two.

The inductance adjusting conductor is preferably a conductor having one of a meander shape or a linear shape and is arranged substantially symmetrically with respect to a point or substantially symmetrically with respect to a line.

A connection point, at which the inductance adjusting conductor is connected to the via hole, is preferably located at an approximate center location with respect to which each ground terminal is point-symmetric or line-symmetric.

The ground terminals are preferably arranged at locations that are point-symmetric or line-symmetric, a plurality of the via holes are provided, and connection points, at which the inductance adjusting conductor is connected to the via holes, are spaced substantially equidistantly away from a center location with respect to which the ground terminals are point-symmetric or line-symmetric.

The noise filter array preferably has a laminated structure, and the filter elements are provided only on one side of the inductance adjusting conductor in a laminated direction.

The four filter elements are preferably arranged substantially parallel to one another.

Conductors defining the coils of the LC parallel resonant circuits and the LC series resonant circuits are arranged at locations that do not overlap one another in a thickness direction thereof.

An inductance adjusting conductor is also preferably provided on the side of the signal-side electrode of the grounding capacitor that defines each of the LC series resonant circuits.

According to preferred embodiments of the present invention, it is possible to easily provide a noise filter array that is configured so that a plurality of LC parallel resonant circuits and LC series resonant circuits, each of which includes a coil and a capacitor, are integrally provided, without requiring any specific complex configuration. In addition, each filter element includes an LC parallel resonant circuit and an LC series resonant circuit, and the LC series resonant circuit includes a grounding capacitor and an inductance adjusting conductor. Thus, it is possible to easily provide a noise filter array that includes a plurality of double-resonance filter elements. Furthermore, a ground-side electrode of the grounding capacitors that define the filter elements arranged substantially parallel to one another is connected to the inductance adjusting conductor through a via hole, and the length of the inductance adjusting conductor from a connection location with the via hole to a ground terminal is substantially equal in each of the filter elements. Thus, variations in inductance value among the filter elements are significantly reduced.

Preferably, two filter elements are provided on each side of the inductance adjusting conductor in a laminated direction. Thus, it is possible to reduce the magnetic influence between the filter elements provided on both sides of the inductance adjusting conductor, and it is possible to substantially equalize magnetic flux distributions that arise in the coils of the filter elements that are arranged substantially in parallel and adjacent to each other. Thus, variations in inductance value among the filter elements may be further reduced. In addition, a noise filter array that includes four filter elements, for example, may be efficiently provided.

Preferably, the inductance adjusting conductor is a conductor preferably having one of a meander shape or a linear shape and is arranged substantially symmetrically with respect to a point or substantially symmetrically with respect to a line. This arrangement is effective to reduce variations in inductance value among the filter elements and also, when an inductance adjusting conductor is formed by plating, it is possible to reduce variations in the plating thickness when forming the conductor. Thus, it is possible to reduce costs.

In addition, when a connection point, at which the inductance adjusting conductor is connected to the via hole, is located at the approximate center location with respect to which each ground terminal is point-symmetric or line-symmetric, not only can variations in inductance value be reduced among the filter elements but also only one via hole is required. Thus, it is possible to reduce costs, and it is possible to easily adjust a resonance frequency.

In addition, a plurality of via holes may be provided when necessary. In this case, by using the configuration of the noise filter array according to preferred embodiments of the present invention, it is possible to reduce variations in inductance value among the filter elements.

When the plurality of filter elements are provided only on one side of the inductance adjusting conductor in its laminated direction, it is possible to reduce the thickness of the component so as to reduce in overall size thereof.

When the four filter elements are arranged substantially in parallel with one another, it is possible to provide a noise filter array that includes four filter elements.

Conductors of the coils that define the LC parallel resonant circuits and the LC series resonant circuits are preferably arranged at locations that do not overlap one another in their thickness direction. Thus, the thickness of the component in the thickness direction is substantially uniform and, as a result, stress at the time of manufacturing is reduced. Thus, it is possible to suppress and prevent the occurrence of cracks between conductors of the coils of the adjacent layers. This improves the yield of the product.

An inductance adjusting conductor is also preferably arranged on the side of the signal-side electrode of the grounding capacitor that defines each of the LC series resonant circuits. Thus, it is possible to set a large inductance value for the series resonant circuit of each filter element and, therefore, it is possible to achieve a lower frequency in each resonant circuit. In addition, the inductance values of the individual filter elements may be individually set.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Hereinafter, preferred embodiments of the present invention will be described with reference to the drawings.

First Preferred Embodiment

Figure 1:
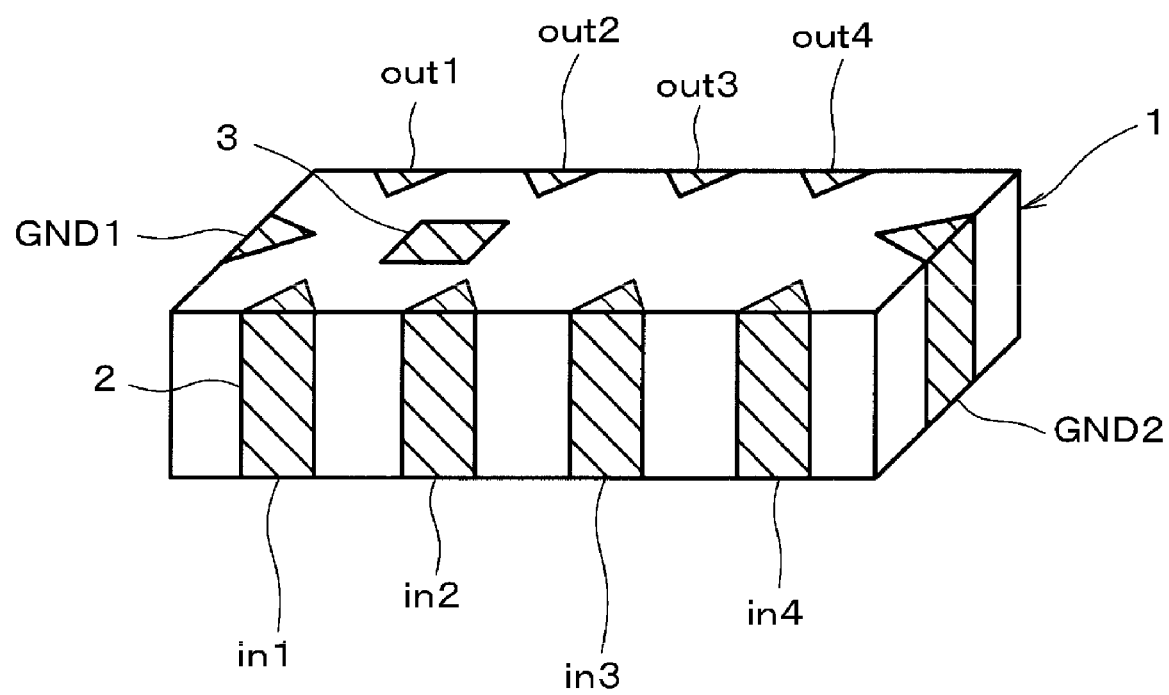
FIG. 1 is an external perspective view of a noise filter array according to a first preferred embodiment of the present invention.
Figure 2:
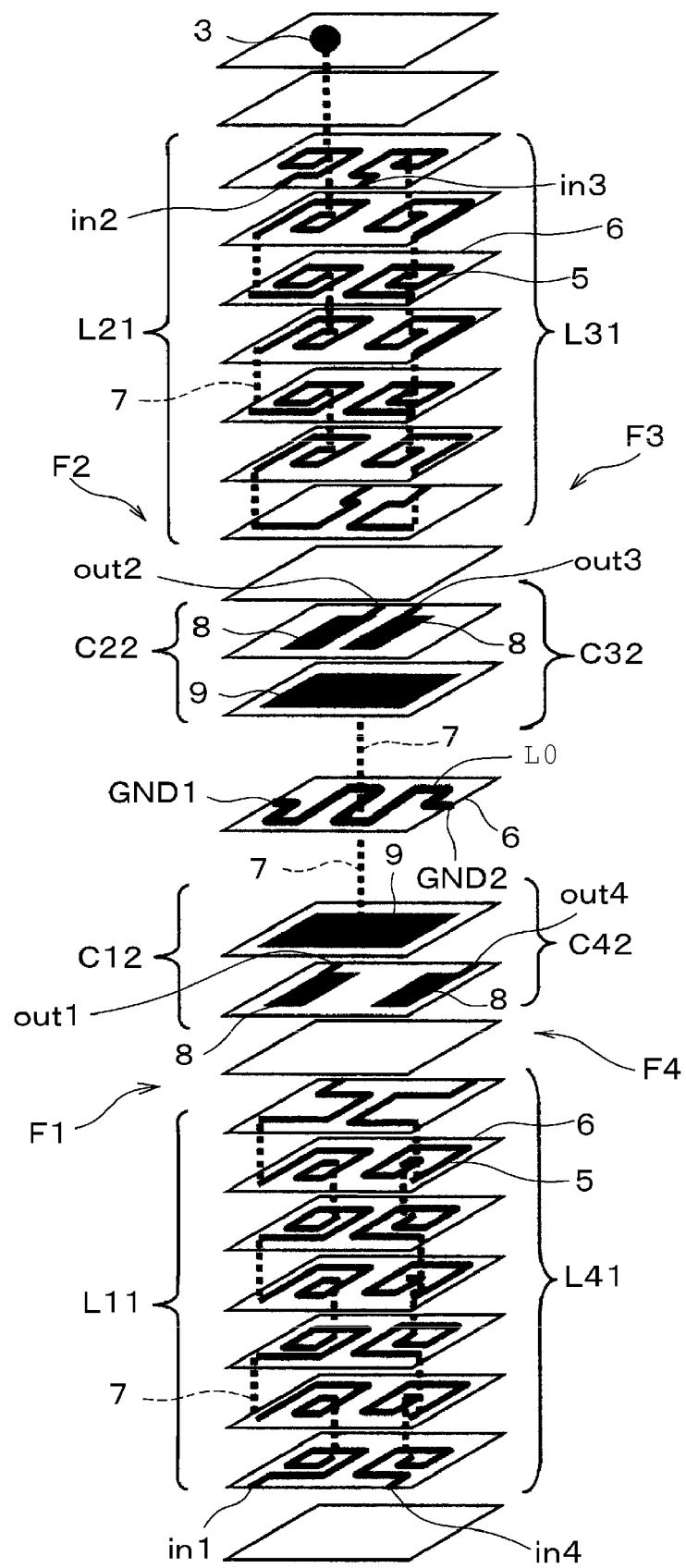
FIG. 2 is an exploded perspective view of the noise filter array according to the first preferred embodiment of the present invention.
Figure 3:
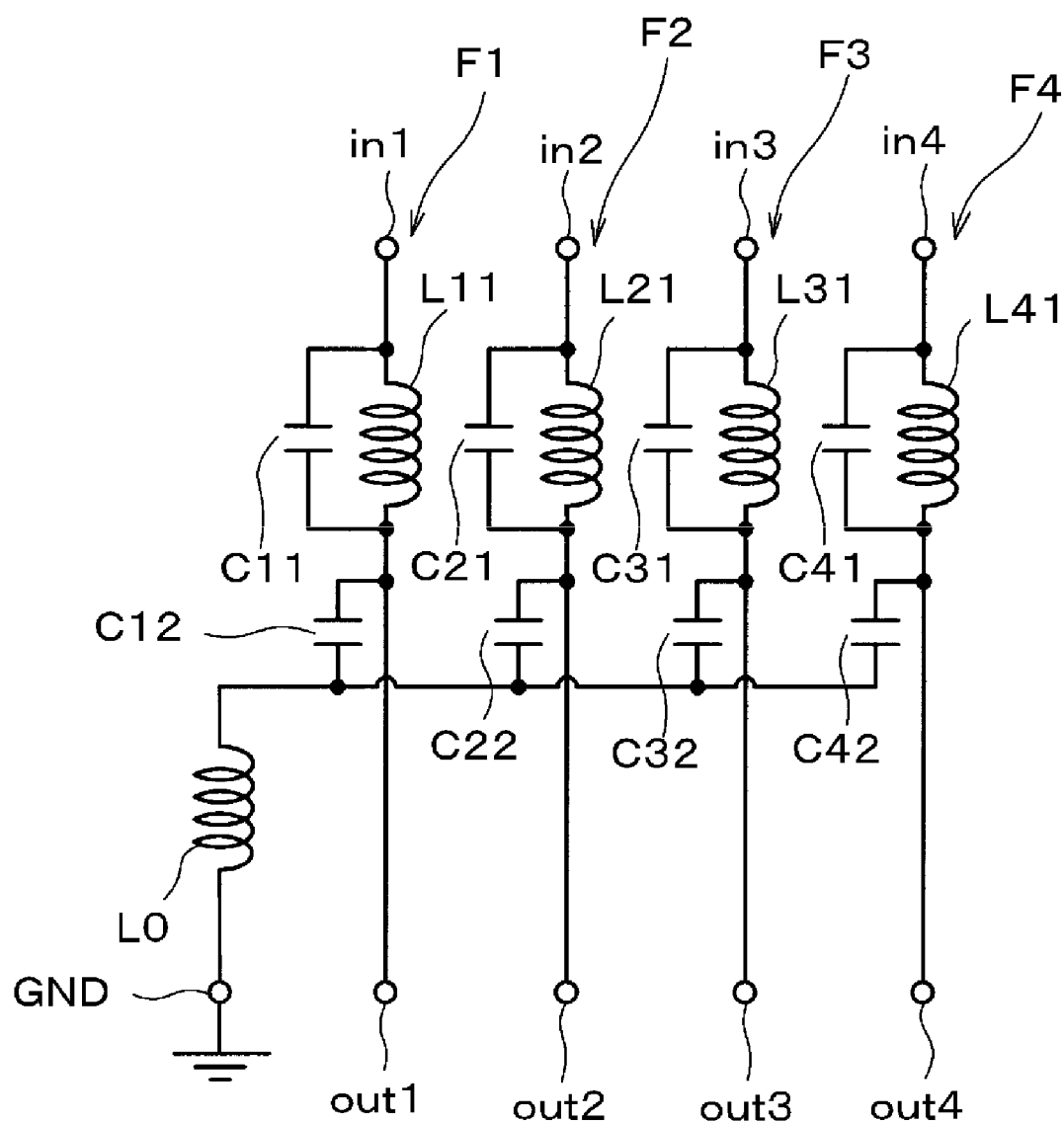
FIG. 3 is an electrical equivalent circuit diagram of the noise filter array according to the first preferred embodiment of the present invention.
Figure 4:
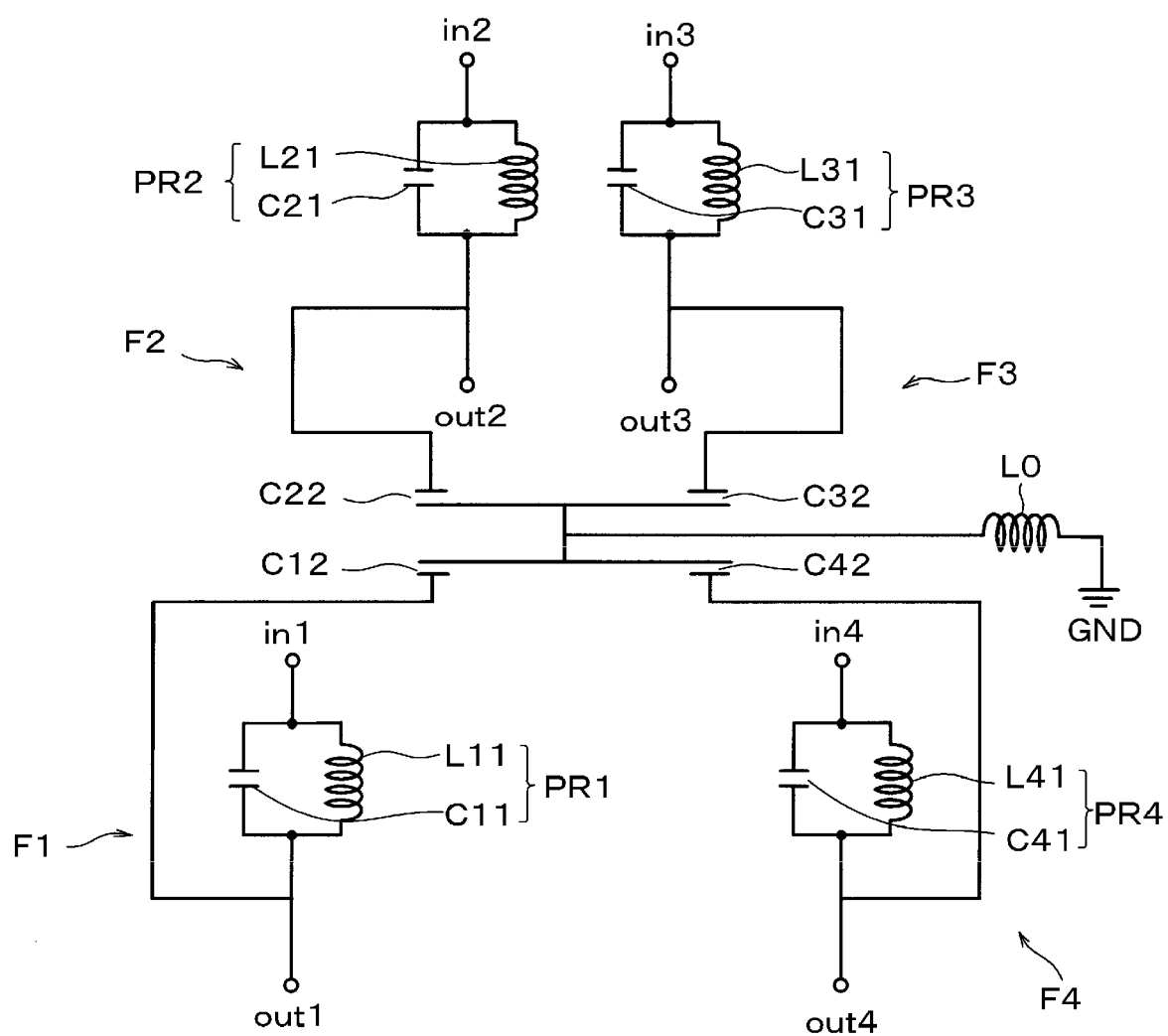
FIG. 4 is an electrical equivalent circuit diagram that shows the rearranged electrical equivalent circuit diagram of FIG. 3 so as to correspond to the exploded perspective view of FIG. 2.

FIG. 1 is an external perspective view of a noise filter array according to a first preferred embodiment of the present invention. FIG. 2 is an exploded perspective view of the noise filter array. FIG. 3 is an electrical equivalent circuit diagram of the noise filter array. FIG. 4 is an electrical equivalent circuit diagram that shows the rearranged electrical equivalent circuit diagram of FIG. 3 so as to correspond to the exploded perspective view of FIG. 2. Hereinafter, the noise filter array according to the first preferred embodiment will be described with reference to FIG. 1 to FIG. 4.

The noise filter array of the first preferred embodiment preferably has a substantially rectangular-parallelepiped-shaped laminated body 1. The laminated body 1 is configured such that substantially rectangular insulating sheets preferably made of a ceramic dielectric material, such as barium titanate, for example, or a ceramic magnetic material, such as ferrite, for example, are laminated and integrally fired. Then, external terminal electrodes 2 are provided on the peripheral surfaces of the laminated body 1. The external electrodes 2 arranged on the front and rear side surfaces of the long sides define signal input terminals in1 to in4 and signal output terminals out1 to out4. In addition, the external electrodes 2 arranged on the right and left side surfaces of the short sides define ground terminals GND1 and GND2. Furthermore, a direction identification mark 3 is provided on the upper surface of the laminated body 1 at a location slightly deviated from the center.

In addition, four double-resonance filter elements F1 to F4, for example, are integrally provided in the laminated body 1, which correspond to the four input terminals in1 to in4 and the output terminals out1 to out4. Note that the filter elements F1 to F4 are arranged respectively on both sides two by two across an inductance adjusting conductor L0, which will be described later, in the thickness direction of the component (laminated direction). That is, two filter elements F2 and F3 are arranged substantially in parallel with each other in a direction perpendicular or substantially perpendicular to the thickness direction above the inductance adjusting conductor L0, and two filter elements F1 and F4 are arranged substantially in parallel with each other in a direction perpendicular or substantially perpendicular to the thickness direction below the inductance adjusting conductor L0.

The filter elements F1 to F4 respectively include LC parallel resonant circuits PR1 to PR4, grounding capacitors C12 to C42, and the single inductance adjusting conductor L0 that functions as an inductance coil (FIG. 4). Then, LC series resonant circuits of the filter elements F1 to F4 respectively include the grounding capacitors C12 to C42 and the single inductance adjusting conductor L0 common to the capacitors C12 to C42.

As shown in FIG. 2, the LC parallel resonant circuits PR1 to PR4 include coils L11 to L41 and stray capacitors C11 to C41, respectively. Each of the coils L11 to L41 has a spiral shape such that a plurality of insulating sheets 6 in which a spiral coil conductor 5 is provided are laminated and the coil conductors 5 in the respective layers are electrically connected through via holes 7. The stray capacitors C11 to C41 are provided due to stray capacitances that inevitably arise due to the formation of the coils. Then, first ends of the coil conductors 5 that define the coils L11 to L41 are respectively connected to the external electrodes 2 that respectively define the input terminals in1 to in4, and second ends are respectively connected to the external electrodes 2 that respectively define the output terminals out1 to out4 of the laminated body 1.

Note that the coil conductors 5 of the LC parallel resonant circuits PR1 to PR4 of the coils L11 to L41 are arranged in shifted locations so as not to overlap one another in the thickness direction. By so doing, the thickness of the laminated body 1 in the thickness direction is substantially uniform and, as a result, internal stress during manufacturing of the laminated body 1 is reduced. Thus, it is possible to prevent the occurrence of cracks between the coil conductors 5 of the adjacent layers, which improves the yield of the product.

On the other hand, the grounding capacitors C12 to C42 of the LC series resonant circuits are arranged such that the signal-side electrode 8 provided on the insulating sheet 6 is arranged to face the ground-side electrode 9 via that insulating sheet 6. The signal-side electrodes 8 are provided separately corresponding to the parallel resonant circuits PR1 to PR4, whereas each of the ground-side electrodes 9 are arranged to face the pair of substantially parallel signal-side electrodes 8 in common.

Then, first ends of the signal-side electrodes 8 are extended to one end on the rear side of the insulating sheets 6 and are respectively connected to the external electrodes 2 that define the output terminals out1 to out4. In addition, the ground-side electrodes 9 are electrically connected to the inductance adjusting conductor L0 through the via holes 7.

In addition, the inductance adjusting conductor L0 has a meander shape and is arranged substantially symmetrically with respect to a point. Then, the inductance adjusting conductor L0 is extended to the left and right ends of the insulating sheet 6, and is connected to the external electrodes 2 that respectively define the ground terminals GND1 and GND2. Note that the noise filter array of the first preferred embodiment is arranged so that the lengths of the inductance adjusting conductor L0 from the location connected to the via holes 7 to the ground terminals GND1 and GND2 are substantially equal among the filter elements F1 to F4. That is, in the first preferred embodiment, the connection points of the inductance adjusting conductor L0 with the via holes 7 located at an approximate center location with respect to which the ground terminals GND1 and GND2 are preferably substantially point-symmetric.

In this manner, in the first preferred embodiment, the ground-side electrode 9 is common to the capacitors C22 and C32 that are arranged substantially in parallel with each other, the ground-side electrode 9 is common to the capacitors C12 and C42 that are arranged substantially parallel with each other. Both of the common ground-side electrodes 9 are preferably connected to the inductance adjusting conductor L0 through the respective via holes 7, and the connection points located at the approximate center location with respect to which the ground terminals GND1 and GND2 are preferably substantially point-symmetric. Thus, the distances from the capacitors C22 and C32 of the elements F2 and F3 that are arranged substantially in parallel with each other to the ground terminals GND1 and GND2 and the distances from the capacitors C12 and C42 of the elements F1 and F4 that are arranged substantially in parallel with each other to the ground terminals GND1 and GND2 are substantially equal. Thus, variations in inductance value among the filter elements F1 to F4 are reduced.

Note that in order to obtain a desired inductance value, the shape of the inductance adjusting conductor L0 may preferably be substantially symmetrical with respect to a line other than the above described point symmetry. In addition, by configuring the shape of the inductance adjusting conductor L0 in the above-described symmetric shape, variations in plating thickness when forming the conductor L0 may preferably be reduced.

Note that the direction identification mark 3 enables the mounting direction of the noise filter array to be identified, and is electrically connected to the coil conductor 5 through the via hole 7. Note that the reason that the direction identification mark 3 is electrically connected to the coil conductor 5 is to ensure plating adhesion of the direction identification mark 3.

To manufacture the above-described noise filter array, a conductive paste preferably including Ag, Pd, Cu or Au, or an alloy thereof, for example, as a conductive component is, for example, applied on the insulating sheets 6 through a method, such as screen printing, for example, to thereby form the coil conductors 5, the signal-side electrodes 8 and ground-side electrodes 9 of the capacitors C12 to C42, the inductance adjusting conductor L0 and the direction identification mark 3. In addition, the via holes 7 are formed such that through-holes for via holes are formed using a laser beam and these through-holes are filled with a conductive paste preferably including a conductive component, such as Ag, Pd, Cu or Au, or an alloy thereof, for example. Then, as shown in FIG. 2, conductors, electrodes, via holes, and other elements are formed on the insulating sheets 6. The insulating sheets 6 are laminated and then pressure-bonded to thereby obtain the laminated body 1. Subsequently, the external electrodes 2, which define the input terminals in1 to in4, the output terminals out1 to out4 and the ground terminals GND1 and GND2, are formed on the side surfaces of the laminated body 1, and then the laminated body 1 is fired. Then, Ni plating or Sn plating, for example, is preferably performed on the surface of each external electrode 2. By so doing, the substantially rectangular-parallelepiped-shaped noise filter array having the structure as shown in FIG. 1 may be obtained.

As described above, in the noise filter array of the first preferred embodiment, the double-resonance filter elements F1 to F4 preferably include the common single inductance adjusting conductor L0. Thus, during manufacturing of the noise filter array, by changing the shape of the conductor L0, it is possible to easily adjust the series resonant (secondary resonance) frequency produced by the capacitors C12 to C42 and the inductance adjusting conductor L0.

Then, in the noise filter array of the first preferred embodiment, the distances from the ground-side electrodes 9 of the capacitors C22 and C32 and the capacitors C12 and C42 that define the LC series resonant circuits to the ground terminals GND1 and GND2 through the via holes 7 and the inductance adjusting conductor L0 are substantially equal among the filter elements F1 to F4. Thus, variations in inductance value among the filter elements F1 to F4 are reduced.

In addition, in the noise filter array of the first preferred embodiment, two filter elements F2 and F3 and two filter elements F1 and F4 are separately arranged respectively on both sides of the ground-side electrodes 9 of the capacitors C12 to C42 in the thickness direction (laminated direction). Thus, it is possible to reduce the magnetic influence between the filter elements F2 and F3 and between the filter elements F1 and F4 on both sides thereof, and it is possible to substantially equalize magnetic flux distributions that are produced in the coils of the filter elements F2 and F3 that are arranged substantially parallel and adjacent to each other and in the coils of the filter elements F1 and F4 that are arranged substantially parallel and adjacent to each other. By so doing, variations in inductance value among the filter elements F1 to F4 may be further reduced.

Figure 5:
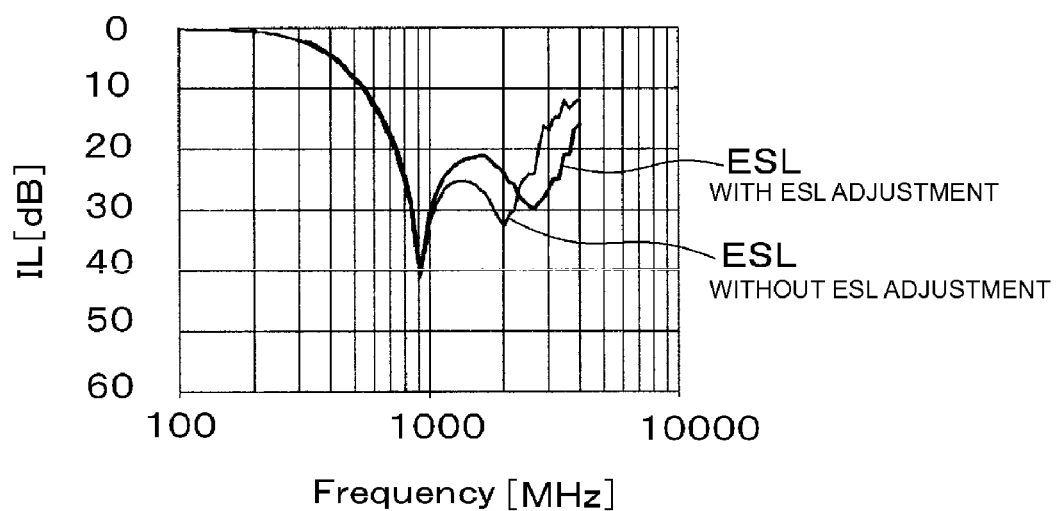
FIG. 5 is a characteristic chart that shows examples of measured results of insertion loss characteristics when an inductance adjusting conductor is provided and when no inductance adjusting conductor is provided, with respect to the noise filter array having the structure according to the first preferred embodiment of the present invention.

FIG. 5 is a characteristic chart that shows examples of measured results of insertion loss characteristics when the inductance adjusting conductor L0 is included and when no inductance adjusting conductor L0 is included.

As shown in FIG. 5, it can be understood that by inserting the inductance adjusting conductor L0, the series resonant (secondary resonant) frequency of each of the filter elements F1 to F4 can preferably be adjusted to a desired frequency (in this example, about 2 GHz).

Figure 6:
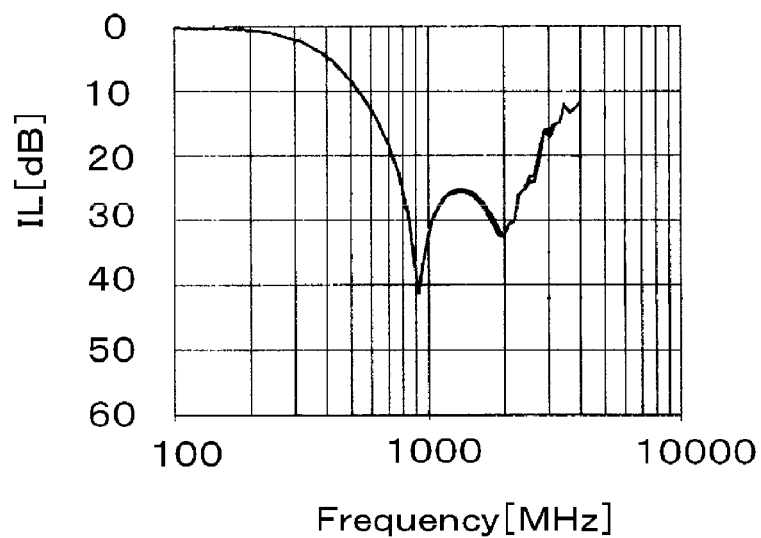
FIG. 6 is a characteristic chart that shows the measured results of an insertion loss characteristic of each filter element, with an inductance adjusting conductor provided, with respect to the noise filter array having the structure according to the first preferred embodiment of the present invention.

FIG. 6 is a characteristic chart that shows the measured results of an insertion loss characteristic of each of the filter elements F1 to F4, with the inductance adjusting conductor L0 provided, in the noise filter array having the structure according to the first preferred embodiment.

From FIG. 6, it appears that by providing the inductance adjusting conductor L0, insertion loss characteristics of the filter elements F1 to F4 are substantially equal, and the characteristics of the filter elements F1 to F4 overlap one another and are represented as one solid line. Thus, there is substantially no difference in characteristic of series resonant (secondary resonant) frequency among the filter elements.

Second Preferred Embodiment

Figure 7:
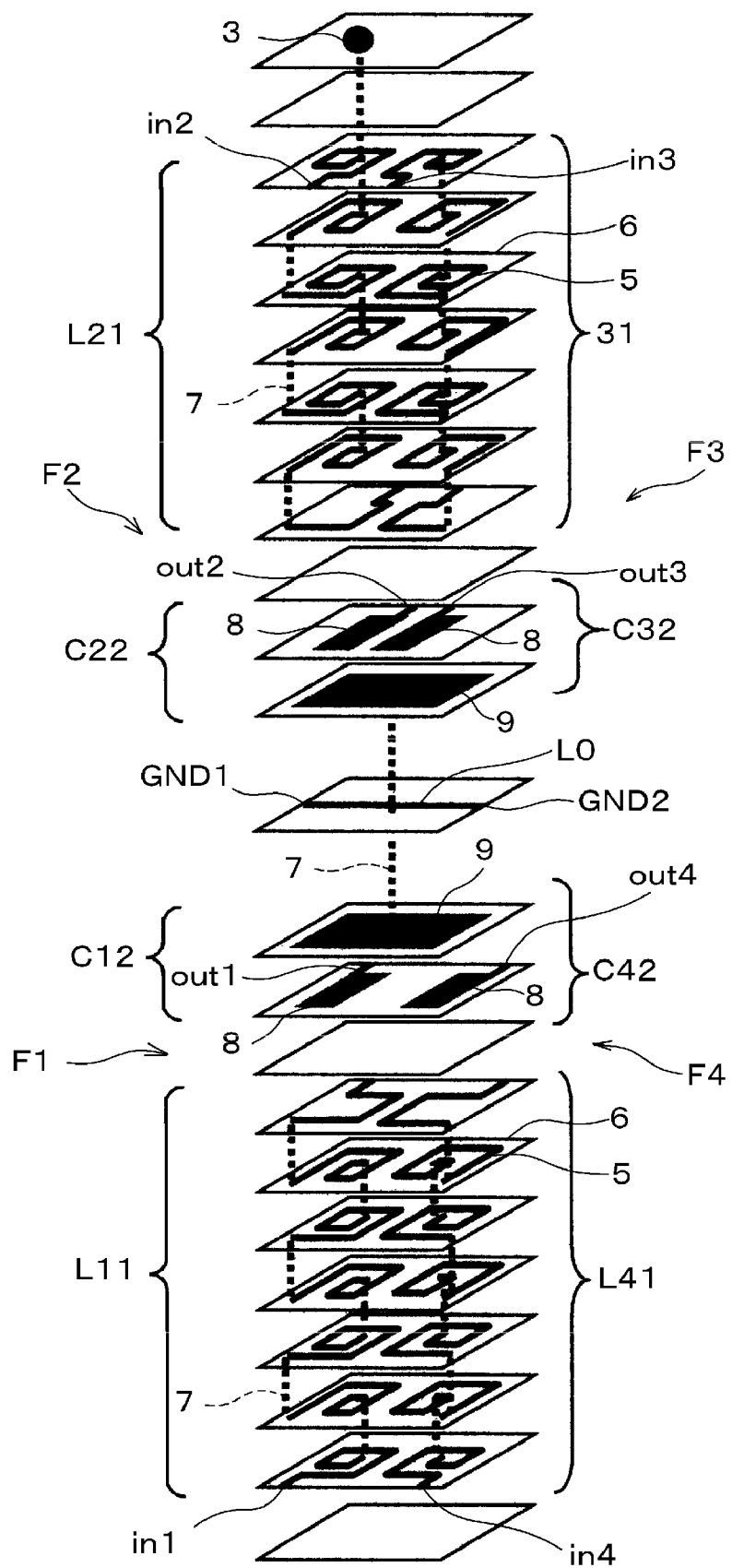
FIG. 7 is an exploded perspective view of a noise filter array according to a second preferred embodiment of the present invention.

FIG. 7 is an exploded perspective view of a noise filter array according to a second preferred embodiment of the present invention. Note that in FIG. 7, portions assigned with the same reference signs as those in FIG. 1 to FIG. 4 are portions similar to or corresponding to the configuration of the first preferred embodiment.

In the noise filter array according to the second preferred embodiment, the inductance adjusting conductor L0 disposed between the capacitors C12 to C42 that define the LC series resonant circuits of the filter elements F1 to F4 has a substantially linear shape.

In the noise filter array of the second preferred embodiment, the distances from the ground-side electrodes 9 of the capacitors C22 and C32 and the capacitors C12 and C42 that define the LC series resonant circuits to the ground terminals GND1 and GND2 through the via holes 7 and the inductance adjusting conductor L0 are substantially equal among the filter elements F1 to F4. Thus, variations in inductance value among the filter elements F1 to F4 are reduced. The remaining configuration, function and advantages are similar to those of the first preferred embodiment shown in FIG. 1 to FIG. 4, and thus, a detailed description thereof is omitted.

Third Preferred Embodiment

Figure 8:
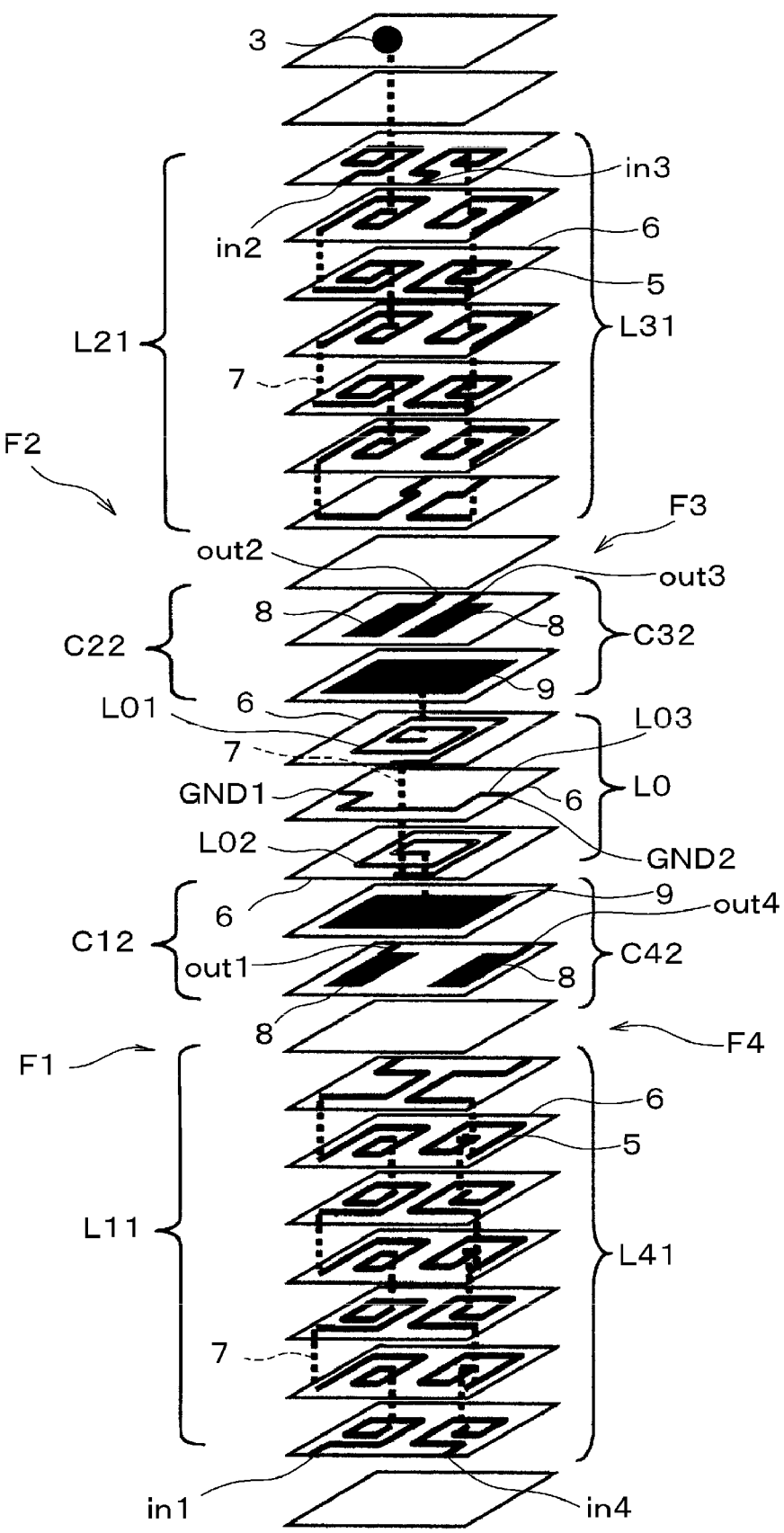
FIG. 8 is an exploded perspective view of a noise filter array according to a third preferred embodiment of the present invention.

FIG. 8 is an exploded perspective view of a noise filter array according to a third preferred embodiment of the present invention. Note that in FIG. 8, portions assigned with the same reference signs as those in FIG. 1 to FIG. 4 are portions similar to or corresponding to the configuration of the first preferred embodiment.

In the first and second preferred embodiments, the inductance adjusting conductor L0 is arranged on the single insulating sheet 6, whereas in the third preferred embodiment, inductance adjusting conductors L01 to L03 are preferably arranged spirally on a plurality of (i.e., three) insulating sheets 6, and the inductance adjusting conductors L01 to L03 are connected to one another through the via holes 7.

In the noise filter array of the third preferred embodiment, the inductance adjusting conductor L03 located in the approximate middle is substantially symmetrically arranged with respect to a line or substantially symmetrically with respect to a point, and the connection points with the via holes 7 are located at the approximate center locations with respect to which the ground terminals GND1 and GND2 are point-symmetric.

According to the configuration of the noise filter array of the third preferred embodiment, not only variations in characteristics among the filter elements F1 to F4 may be reduced but also large inductance values may be set for the LC series resonant circuits of the filter elements F1 to F4. Thus, it is possible to obtain a lower frequency. The remaining configuration, function and advantages are similar to those of the first preferred embodiment shown in FIG. 1 to FIG. 4, and thus detailed description thereof is omitted.

Fourth Preferred Embodiment

Figure 9:
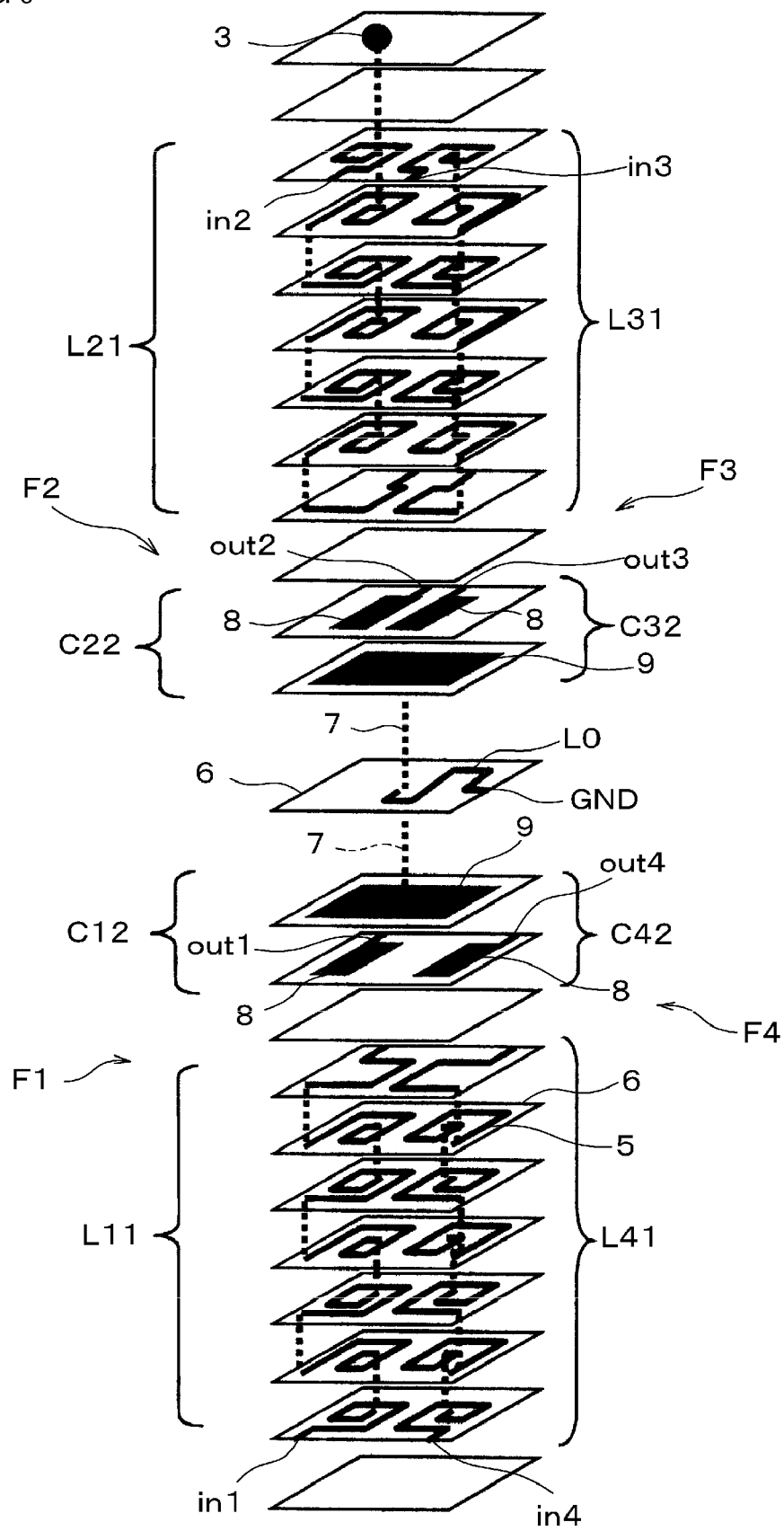
FIG. 9 is an exploded perspective view of a noise filter array according to a fourth preferred embodiment of the present invention.

FIG. 9 is an exploded perspective view of a noise filter array according to a fourth preferred embodiment of the present invention. Note that in FIG. 9, portions assigned with the same reference signs as those in FIG. 1 to FIG. 4 are portions similar to or corresponding to the configuration of the first preferred embodiment.

In the first to third preferred embodiments, the inductance adjusting conductor L0 (first and second preferred embodiments) or L03 (third preferred embodiment) extends to the left and right ends of the insulating sheet 6 and is connected to the external electrode 2 that define two ground terminals GND1 and GND2, whereas in the fourth preferred embodiment, one end of the inductance adjusting conductor L0 is connected to the via hole 7 and the other end extends to one-side end of the insulating sheet 6 and is connected to the external electrode that defines a single ground terminal GND.

In the fourth preferred embodiment, plating adhesion is somewhat reduced when the inductance adjusting conductor L0 is formed by electrolytic plating. However, the distances from the ground-side electrodes 9 of the capacitors C22 and C32 and the capacitors C12 and C42 that define the LC series resonant circuits to the ground terminal GND through the via holes 7 and the inductance adjusting conductor L0 are substantially equal among the filter elements F1 to F4. Thus, variations in inductance values among the filter elements F1 to F4 are reduced. The remaining configuration, function and advantages are similar to those of the first preferred embodiment shown in FIG. 1 to FIG. 4, and thus, detailed description thereof is omitted.

Fifth Preferred Embodiment

Figure 10:
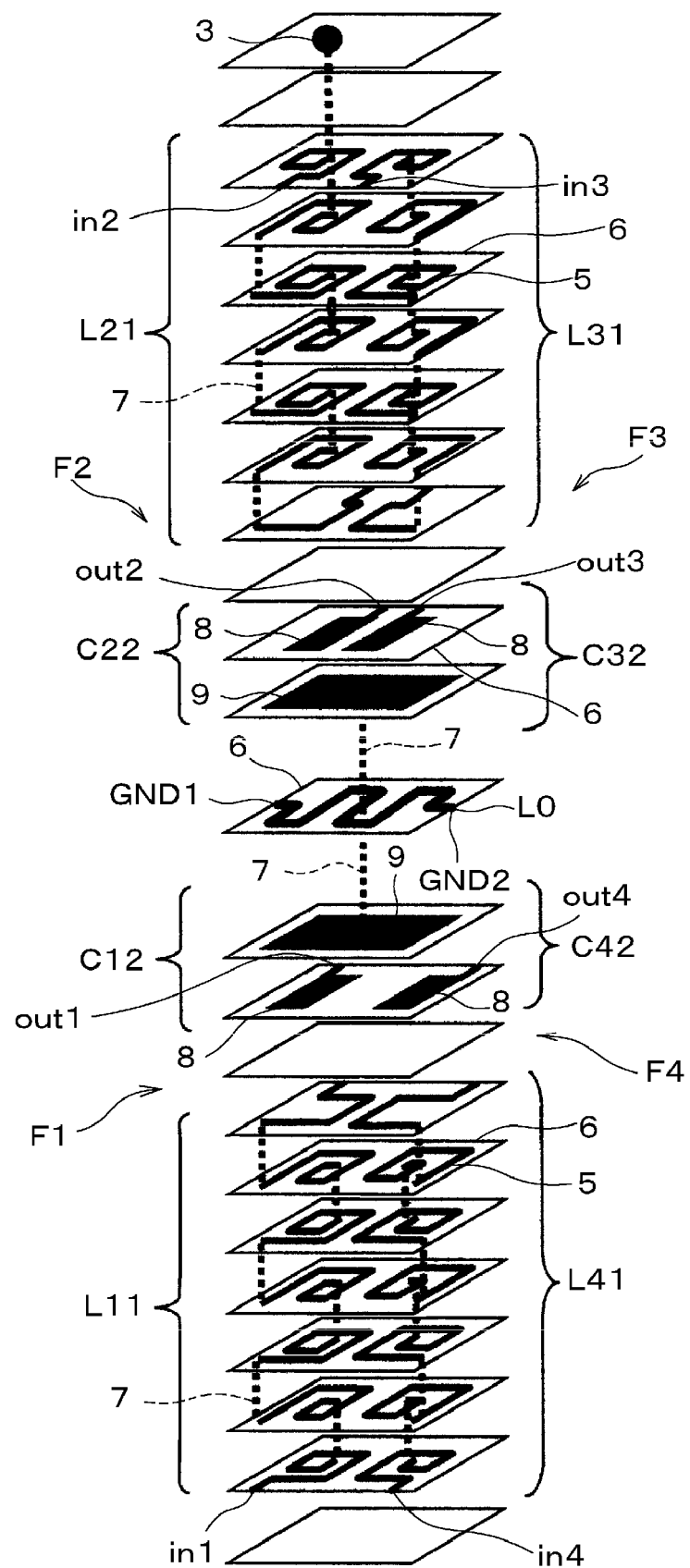
FIG. 10 is an exploded perspective view of a noise filter array according to a fifth preferred embodiment of the present invention.

FIG. 10 is an exploded perspective view of a noise filter array according to a fifth preferred embodiment of the present invention. Note that in FIG. 10, portions assigned with the same reference signs as those in FIG. 1 to FIG. 4 are portions similar to or corresponding to the configuration of the first preferred embodiment.

In the first to third preferred embodiments, the via hole 7 is connected at the approximate center of the inductance adjusting conductor L0 connected to the external electrodes 2 that define two ground terminals GND1 and GND2, whereas in the fifth preferred embodiment, two via holes 7 are provided. Then, the connection points between the inductance adjusting conductor L0 and the via holes 7 are preferably spaced substantially equidistantly away from the center of symmetry of the left and right ground terminals GND1 and GND2.

Thus, in the fifth preferred embodiment, reliable electrical connection is established between the ground-side electrodes 9 of the capacitors C12 to C42 and the inductance adjusting conductor L0, and the inductance values may be made substantially equal among the filter elements F1 to F4. Thus, it is possible to reduce variations in filter characteristic. The remaining configuration, function and advantages are similar to those of the first preferred embodiment shown in FIG. 1 to FIG. 4, and thus, detailed description thereof is omitted.

Sixth Preferred Embodiment

Figure 11:
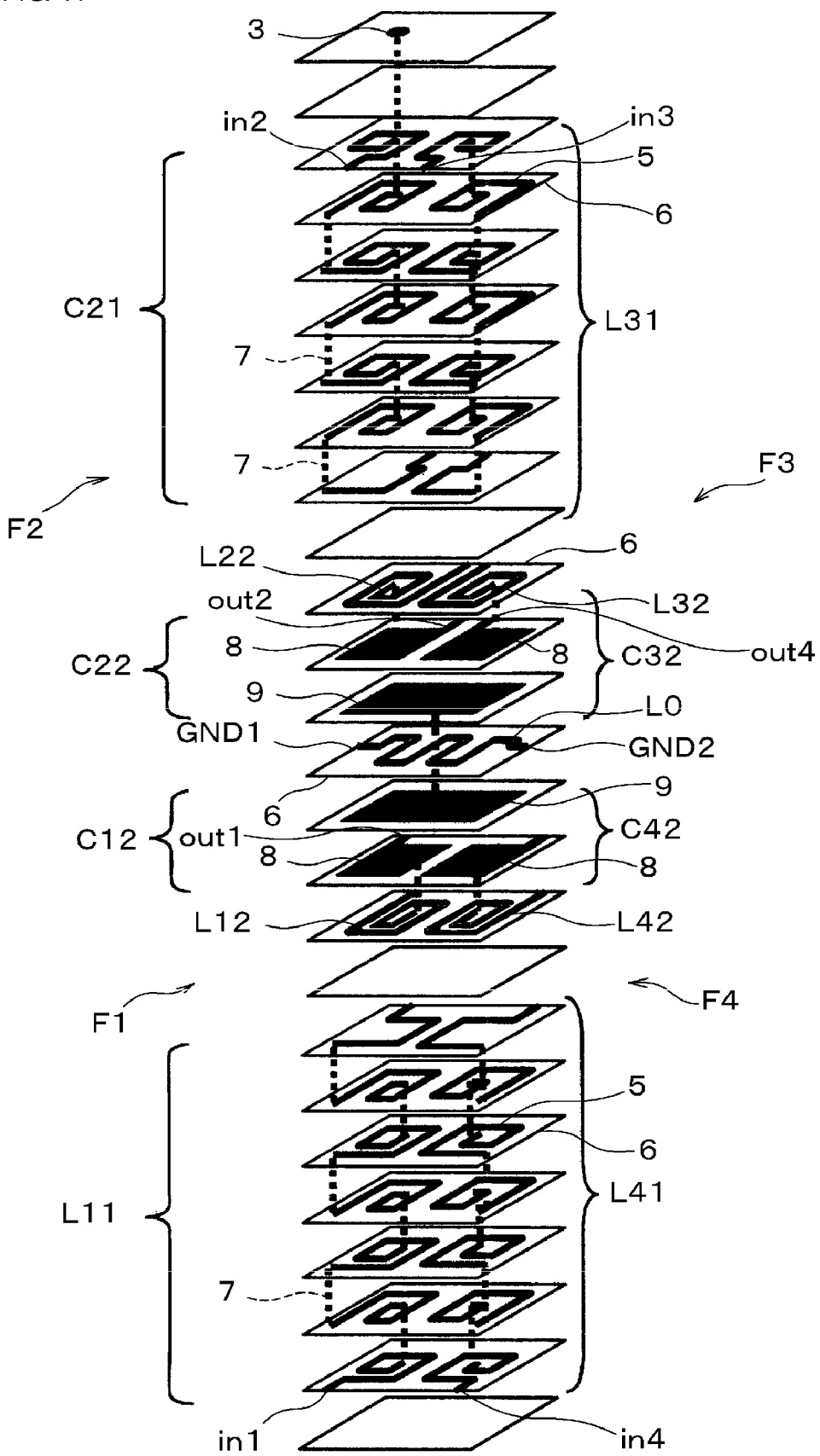
FIG. 11 is an exploded perspective view of a noise filter array according to a sixth preferred embodiment of the present invention.

FIG. 11 is an exploded perspective view of a noise filter array according to a sixth preferred embodiment of the present invention. Note that in FIG. 11, portions assigned with the same reference signs as those in FIG. 1 to FIG. 4 are portions similar to or corresponding to the configuration of the first preferred embodiment.

In the first to fifth preferred embodiments, the inductance adjusting conductor L0 is provided at a location arranged between the upper and lower ground-side electrodes 9 that define the grounding capacitors C12 to C42, whereas in the sixth preferred embodiment, inductance adjusting conductors L12 to L42 are preferably separately provided respectively for the signal-side electrodes 8 of the grounding capacitors C12 to C42, and the signal-side electrodes 8 are electrically connected respectively to the inductance adjusting conductors L12 to L42 through the via holes 7.

As in the third preferred embodiment, when the inductance adjusting conductors L12 to L42 are arranged on the sides of the signal-side electrodes 8 of the grounding capacitors C12 to C42 that define the LC series resonant circuits, the inductance values of the LC series resonant circuits of the filter elements F1 to F4 may be set so as to be preferably greater than when the single inductance adjusting conductor L0 is provided. Thus, it is possible to gain a further low frequency in each resonant circuit. In addition, the inductance values of the individual filter elements F1 to F4 may be set separately. The remaining configuration, function and advantages are similar to those of the first preferred embodiment shown in FIG. 1 to FIG. 4, and thus, detailed description thereof is omitted.

Seventh Preferred Embodiment

Figure 12:
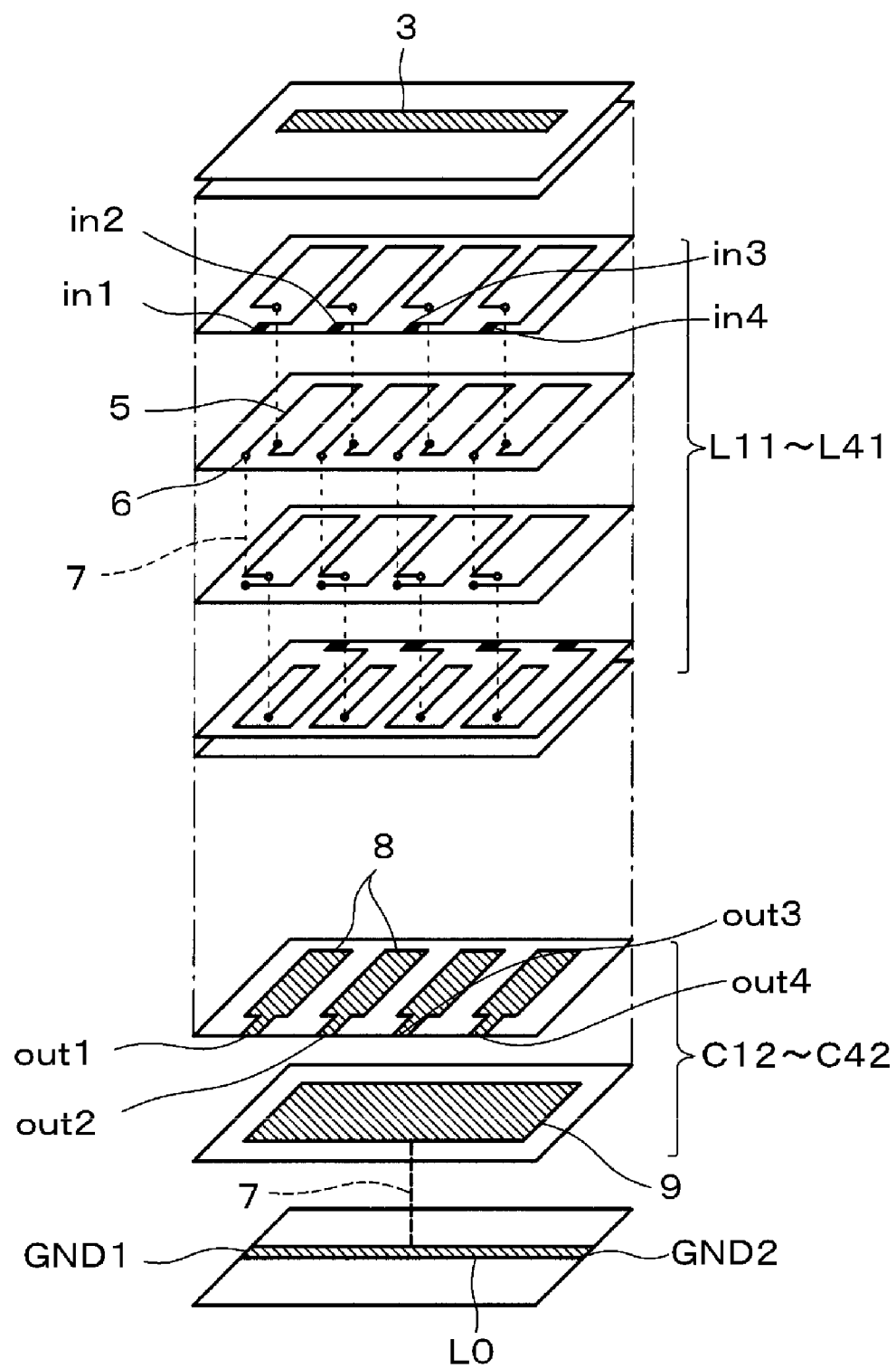
FIG. 12 is an exploded perspective view of a noise filter array according to a seventh preferred embodiment of the present invention.
Figure 13:
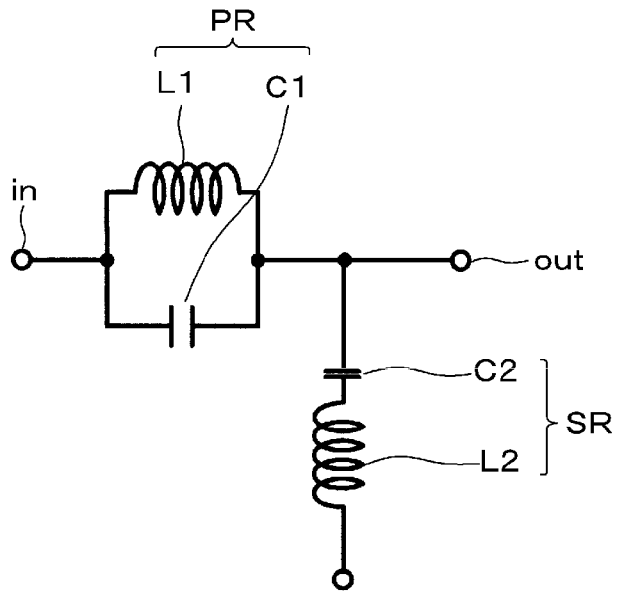
FIG. 13 is an electrical equivalent circuit diagram of a known double-resonance filter element including an LC parallel resonant circuit and an LC series resonant circuit.
Figure 14:
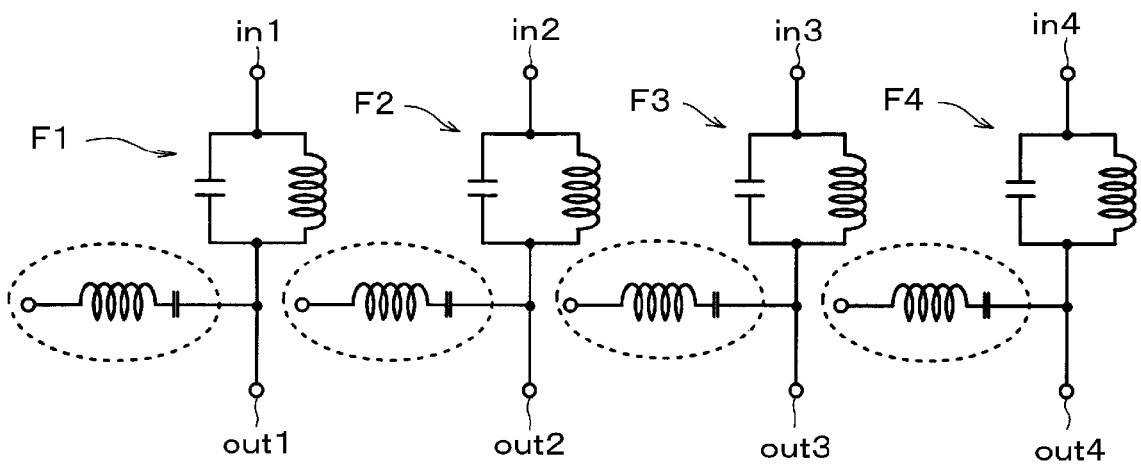
FIG. 14 is an electrical equivalent circuit diagram that shows an example in which four known double-resonance filter elements are arranged in an array.
Figure 15:
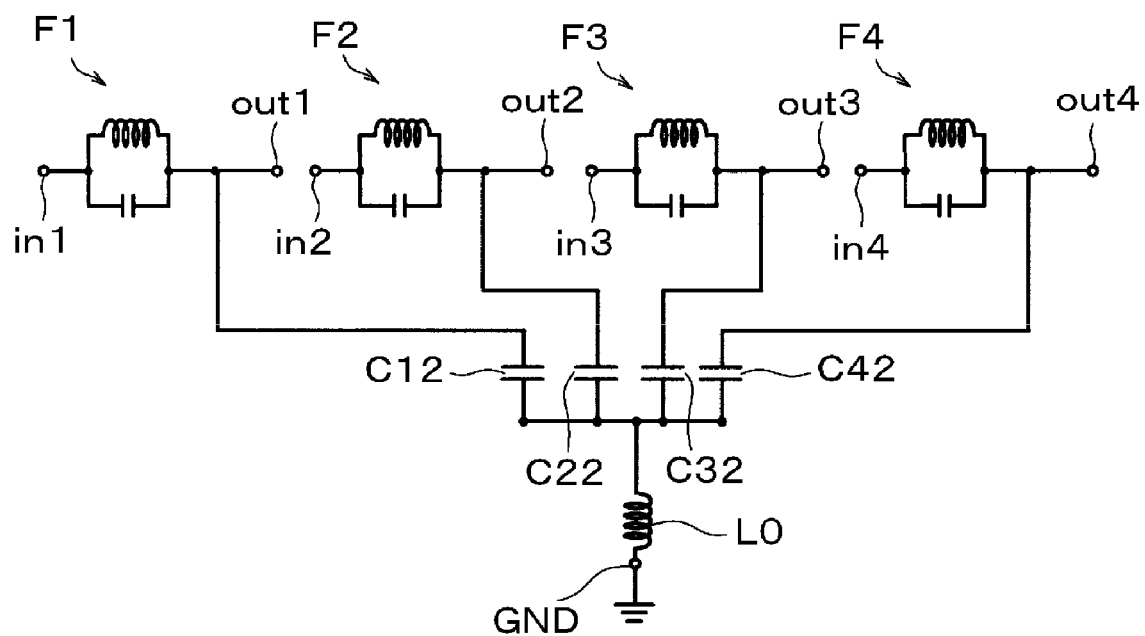
FIG. 15 is an electrical equivalent circuit diagram that shows a noise filter array that is obtained when coils are integrated in order to simplify the structure shown in FIG. 14.

FIG. 12 is an exploded perspective view of a noise filter array according to a seventh preferred embodiment of the present invention. Note that in FIG. 12, portions assigned with the same reference signs as those in FIG. 1 to FIG. 4 are portions similar to or corresponding to the configuration of the first preferred embodiment.

In the first to sixth preferred embodiments, two filter elements F2 and F3 and two filter elements F1 and F4 are arranged respectively on both sides of the inductance adjusting conductor L0 in the thickness direction (laminated direction), whereas in the noise filter array of the seventh preferred embodiment, the filter elements F1 to F4 are preferably provided on only one side of the inductance adjusting conductor L0, that is, in FIG. 12, preferably on only the upper side in the laminated direction of the layer in which the inductance adjusting conductor L0 is arranged. That is, the filter elements F1 to F4 are arranged substantially parallel to one another in a direction perpendicular or substantially perpendicular to the thickness direction of the component.

In the noise filter array of the seventh preferred embodiment, because the filter elements F1 to F4 are preferably arranged parallel or substantially parallel to one another, magnetic flux distributions that are produced in the coils L11 to L41 of the filter elements F1 to F4 are somewhat different from one another and, therefore, variations in inductance value easily arise among the filter elements F1 to F4. However, the plurality of filter elements F1 to F4 are provided on only one side of the inductance adjusting conductor L0, such that the thickness of the component may preferably be reduced as compared to the first to sixth preferred embodiments. The remaining configuration, function and advantages are similar to those of the first preferred embodiment shown in FIG. 1 to FIG. 4, and thus, detailed description thereof is omitted.

Note that in the first to seventh preferred embodiments, a case in which the individual component shown in FIG. 1 preferably is separately produced is described. In volume production, a mother laminated body that integrates a plurality of laminated bodies is preferably manufactured, and then the mother laminated body is cut to obtain the laminated body 1 shown in FIG. 1, thus making it possible to obtain individual components.

In addition, in the first to seventh preferred embodiments, a case in which the coil conductors 5, the signal-side electrodes 8, the ground-side electrodes 9, and the via holes 7 are provided on the insulating sheets 6, and the insulating sheets 6 are laminated and then integrally fired is described. Instead, pre-fired insulating sheets 6 may preferably be used and the pre-fired insulating sheets 6 may preferably be laminated and pressure-bonded to obtain the laminated body 1.

Furthermore, after an insulating layer is formed by applying a paste insulating material through a method, such as printing, for example, a paste conductive material is applied on the insulating layer to thereby form the coil conductors 5, the signal-side electrodes 8, the ground-side electrodes 9, and at the same time, the via holes 7 are formed where necessary and subsequently a paste insulating material is applied thereon to form an insulating layer. In this manner, forming an insulating layer by applying an insulating material and forming a conductor by applying a conductive material are sequentially repeated to perform overcoating. Thus, a noise filter array having a laminated structure may preferably be manufactured.

In addition, in the first to seventh preferred embodiments, the noise filter array that includes four filter elements F1 to F4 is described. However, preferred embodiments of the present invention are not specifically limited to this number of filter elements. Preferred embodiments of the present invention may preferably be widely applied to a noise filter array that includes any suitable number of filter elements.

In addition, in the noise filter array of the first to seventh preferred embodiments, each of the filter elements F1 to F4 preferably includes the LC parallel resonant circuit and the LC series resonant circuit. However, preferred embodiments of the present invention are not limited thereto. For example, it is applicable that a noise filter array includes a plurality of ladder filter elements, such as π type or T type, that are arranged substantially parallel to one another in an array and integrally provided.

The present invention is not limited to the above-described preferred embodiments, and various applications or modifications are possible without departing from the scope and spirit of the invention.

According to preferred embodiments of the present invention, it is possible to obtain a noise filter array that has less variations in characteristic among a plurality of filter elements with a simple structure. Thus, the noise filter array of preferred embodiments of the present invention may be widely utilized, for example, in a cellular phone that uses multiple communication bands to remove noise in the multiple communication bands.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A noise filter array comprising:
  a plurality of filter elements, each of which includes an LC parallel resonant circuit including a coil and a capacitor and an LC series resonant circuit, arranged substantially parallel to one another in an array and integrally provided; wherein
  the LC series resonant circuits are defined by grounding capacitors including a single common ground-side electrode and signal-side electrodes, and a single inductance adjusting conductor common to the grounding capacitors;
  the single common ground-side electrode of the grounding capacitors of the LC series resonant circuits is arranged so as to face the signal-side electrodes of the grounding capacitors, and the common ground-side electrode is connected through a via hole to the inductance adjusting conductor; and
  a length from a connection location, at which the inductance adjusting conductor is connected to the via hole, to a ground terminal is substantially equal in each of the plurality of filter elements.

2. The noise filter array according to claim 1, wherein the inductance adjusting conductor is a conductor having one of a meander shape or a linear shape and is arranged substantially symmetrically with respect to a point or substantially symmetrically with respect to a line.

3. The noise filter array according to claim 2, wherein the connection location, at which the inductance adjusting conductor is connected to the via hole, is arranged at an approximate center location with respect to which each of the ground terminals is substantially point-symmetric or substantially line-symmetric.

4. The noise filter array according to claim 2, wherein the ground terminals are arranged at locations that are substantially point-symmetric or substantially line-symmetric, a plurality of the via holes are provided, and the connection locations, at which the inductance adjusting conductor is connected to the via holes, are spaced substantially equidistantly away from a center location with respect to which the ground terminals are substantially point-symmetric or substantially line-symmetric.

5. The noise filter array according to claim 1, wherein the noise filter array has a laminated structure, and the filter elements are provided on only one side of the inductance adjusting conductor in a laminated direction.

6. The noise filter array according to claim 5, wherein four of the filter elements are provided and arranged substantially parallel to one another.

7. The noise filter array according to claim 1, wherein conductors defining the coils of the LC parallel resonant circuits and the LC series resonant circuits are arranged at locations that do not overlap one another in a thickness direction of the conductors.

8. The noise filter array according to claim 1, wherein another inductance adjusting conductor is provided on a side of the signal-side electrode of the grounding capacitor that defines each of the LC series resonant circuits.

9. A noise filter array comprising:

a plurality of filter elements, each of which includes an LC parallel resonant circuit including a coil and a capacitor and an LC series resonant circuit, arranged substantially parallel to one another in an array and integrally provided; wherein the LC series resonant circuits are defined by grounding capacitors including a single common ground-side electrode and signal-side electrodes, and a single inductance adjusting conductor common to the grounding capacitors;

the single common ground-side electrode of grounding capacitors of the LC series resonant circuits of two filter elements of the plurality of filter elements is arranged so as to face the signal-side electrodes of the grounding capacitors, and the ground-side electrode is connected through a via hole to the inductance adjusting conductor; and a length from a connection location, at which the inductance adjusting conductor is connected to the via hole, to a ground terminal is substantially equal in each of the plurality of filter elements, and the plurality of filter elements are arranged on both sides of the inductance adjusting conductor in a laminated direction two by two.

10. The noise filter array according to claim 9, wherein the inductance adjusting conductor is a conductor having one of a meander shape or a linear shape and is arranged substantially symmetrically with respect to a point or substantially symmetrically with respect to a line.

11. The noise filter array according to claim 10, wherein the connection location, at which the inductance adjusting conductor is connected to the via hole, is arranged at an approximate center location with respect to which each of the ground terminals is substantially point-symmetric or substantially line-symmetric.

12. The noise filter array according to claim 10, wherein the ground terminals are arranged at locations that are substantially point-symmetric or substantially line-symmetric, a plurality of the via holes are provided, and the connection locations, at which the inductance adjusting conductor is connected to the via holes, are spaced substantially equidistantly away from a center location with respect to which the ground terminals are substantially point-symmetric or substantially line-symmetric.

13. The noise filter array according to claim 9, wherein conductors defining the coils of the LC parallel resonant circuits and the LC series resonant circuits are arranged at locations that do not overlap one another in a thickness direction of the conductors.

14. The noise filter array according to claim 9, wherein another inductance adjusting conductor is provided on a side of the signal-side electrode of the grounding capacitor that defines each of the LC series resonant circuits.

* * * * *